United States Patent
Pham et al.

(10) Patent No.: US 9,466,491 B2
(45) Date of Patent: Oct. 11, 2016

(54) METHODS OF FORMING A SEMICONDUCTOR DEVICE WITH A SPACER ETCH BLOCK CAP AND THE RESULTING DEVICE

(71) Applicant: GLOBALFOUNDRIES Inc., Grand Cayman (KY)

(72) Inventors: Daniel T. Pham, Clifton Park, NY (US); Hyun-Jin Cho, Palo Alto, CA (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 7 days.

(21) Appl. No.: 14/268,579

(22) Filed: May 2, 2014

(65) Prior Publication Data

US 2015/0318178 A1    Nov. 5, 2015

(51) Int. Cl.
*H01L 21/28* (2006.01)
*H01L 21/283* (2006.01)
*H01L 29/423* (2006.01)
*H01L 29/417* (2006.01)
*H01L 21/768* (2006.01)

(52) U.S. Cl.
CPC .............. *H01L 21/28* (2013.01); *H01L 21/283* (2013.01); *H01L 21/28247* (2013.01); *H01L 21/76897* (2013.01); *H01L 29/417* (2013.01); *H01L 29/41775* (2013.01); *H01L 29/423* (2013.01); *H01L 29/42364* (2013.01)

(58) Field of Classification Search
None
See application file for complete search history.

(56) References Cited

U.S. PATENT DOCUMENTS 6,277,758 B1 *   8/2001   Ko ................................. 438/706
2014/0353734 A1 * 12/2014   Xie et al. ...................... 257/288

* cited by examiner

*Primary Examiner* — Anthony Ho
*Assistant Examiner* — Kevin Quinto
(74) *Attorney, Agent, or Firm* — Amerson Law Firm, PLLC

(57) ABSTRACT

One illustrative method disclosed herein includes, among other things, forming a sacrificial gate structure above a semiconductor substrate, forming a sidewall spacer adjacent opposite sides of the sacrificial gate structure, removing the sacrificial gate structure and forming a replacement gate structure in its place, at some point after forming the replacement gate structure, performing an etching process to reduce the height of the spacers so as to thereby define recessed spacers having an upper surface that partially defines a spacer recess, and forming a spacer etch block cap on the upper surface of each recessed spacer structure and within the spacer recess.

22 Claims, 8 Drawing Sheets

METHODS OF FORMING A SEMICONDUCTOR DEVICE WITH A SPACER ETCH BLOCK CAP AND THE RESULTING DEVICE

BACKGROUND OF THE INVENTION

1. Field of the Invention

The present disclosure generally relates to the fabrication of integrated circuits, and, more particularly, to various methods of forming a semiconductor device with a spacer etch block cap, and the resulting semiconductor device.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits fabricated using MOS technology, field effect transistors (FETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In general, as a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first lower end of which is connected to a respective contact region of a circuit element, such as a gate electrode and/or the drain and source regions of transistors, and a second end is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

In some cases, the second, upper end of the contact structure may be connected to a contact region of another semiconductor-based circuit element, in which case the interconnect structure in the contact level is also referred to as a local interconnect. These local interconnect structures typically connect circuit elements, e.g., transistors, resistors, etc., that are formed on different spaced-apart active regions that are electrically isolated from one another. Such local interconnect structures are generally line-type structures that are formed in the interlayer dielectric material below the metallization system of the product.

As device dimensions have decreased, e.g., transistors with gate lengths of 50 nm and less, the contact elements in the contact level have to be provided with critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, at least the sidewall spacers of the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the spacer structures, i.e., the portions exposed by the global contact opening, as an etch mask. Thereafter, an appropriate contact material, such as tungsten and the like, may be filled into the contact trenches.

However, the aforementioned process of forming self-aligned contacts results in an undesirable loss of at least portions of the spacer materials that protect the conductive gate electrode, as will be explained with reference to FIGS. 1A-1B. FIG. 1A schematically illustrates a cross-sectional view of an integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14. An illustrative gate cap layer 16 and sidewall spacers 18 encapsulate and protect the gate structures 11. The gate cap layer 16 and sidewall spacers 18 are typically made of silicon nitride. Also depicted in FIG. 1A are a plurality of raised source/drain regions 20 and a layer of insulating material 22, e.g., silicon dioxide. FIG. 1B depicts the product 10 after an opening 24 has been formed in the layer of insulating material 22 for a self-aligned contact. Although the contact etch process performed to form the opening 24 is primarily directed at removing the desired portions of the layer of insulating material 22, portions of the protective gate cap layer 16 and the protective sidewall spacers 18 get consumed during the contact etch process, as simplistically depicted in the dashed regions 26. Given that the cap layer 16 and the spacers 18 are attacked in the contact etch process, the thickness of these protective materials must be sufficient such that, even after the contact etch process is completed, there remains sufficient material to protect the gate structures 11. Accordingly, device manufacturers tend to make the cap layers 16 and spacers 18 having an additional thickness that may otherwise not be required but for the consumption of the cap layers 16 and the spacers 18 during the contact etch process. In turn, increasing the thickness of such structures, i.e., increasing the thickness of the gate cap layers 16, causes other problems, such as increasing the aspect ratio of the contact opening 24 due to the increased height, increasing the initial gate height, which makes the gate etching and spacer etching processes more difficult, etc.

The present disclosure is directed to various methods of forming a semiconductor device with a spacer etch block cap, and the resulting semiconductor device, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a semiconductor device with a protected gate cap layer, and the resulting semiconductor device. One illustrative method disclosed herein includes, among other things, forming a sacrificial gate structure above a semiconductor substrate, forming a sidewall spacer adjacent opposite sides of the sacrificial gate structure, removing the sacrificial gate structure and forming a replacement gate structure in its place, at some point after forming the replacement gate structure, performing an etching process to reduce the height of the spacers so as to thereby define recessed spacers having an upper surface that partially defines a spacer recess, and forming a spacer etch block cap on the upper surface of each recessed spacer structure and within the spacer recess.

A further illustrative method disclosed herein includes, among other things, forming a sacrificial gate structure above a semiconductor substrate, forming a sidewall spacer adjacent opposite sides of the sacrificial gate structure, forming a first layer of insulating material above the substrate, removing the sacrificial gate structure so as to thereby define a replacement gate cavity, forming a replacement gate structure in the replacement gate cavity, forming a gate cap layer above the replacement gate structure, after forming the gate cap layer, performing an etching process to reduce the height of the spacers so as to thereby define recessed spacers with a spacer recess formed thereabove, wherein the spacer recess is defined by an upper surface of the recessed spacer, the first layer of insulating material and the gate cap layer, and forming a spacer etch block cap on the upper surface of each recessed spacer structure and within the spacer recess.

One illustrative example of a novel transistor device disclosed herein includes, among other things, a gate structure positioned above a semiconductor substrate, a spacer positioned adjacent opposite sides of the gate structure, a gate cap layer positioned above the gate structure, wherein an upper surface of the gate cap layer is positioned above the upper surface of the spacers, a first layer of insulating material positioned above the substrate, wherein an upper surface of the first layer of insulating material is substantially planar with the upper surface of the gate cap layer and wherein the upper surface of the spacer, the first layer of insulating material and the gate cap layer define a spacer recess above each of the spacers and a spacer etch block cap positioned on the upper surface of each spacer and within the spacer recess.

BRIEF DESCRIPTION OF THE DRAWINGS

The disclosure may be understood by reference to the following description taken in conjunction with the accompanying drawings, in which like reference numerals identify like elements, and in which.

Figure 1A:
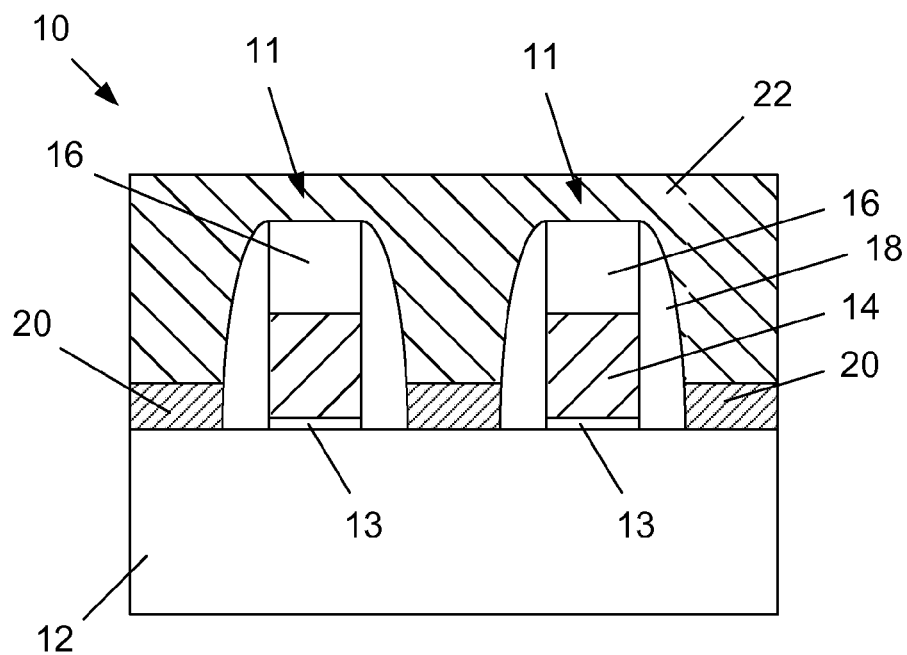
FIGS. 1A-1B schematically illustrate a cross-sectional view of an illustrative prior art integrated circuit product that employs self-aligned contacts.
Figure 1B:
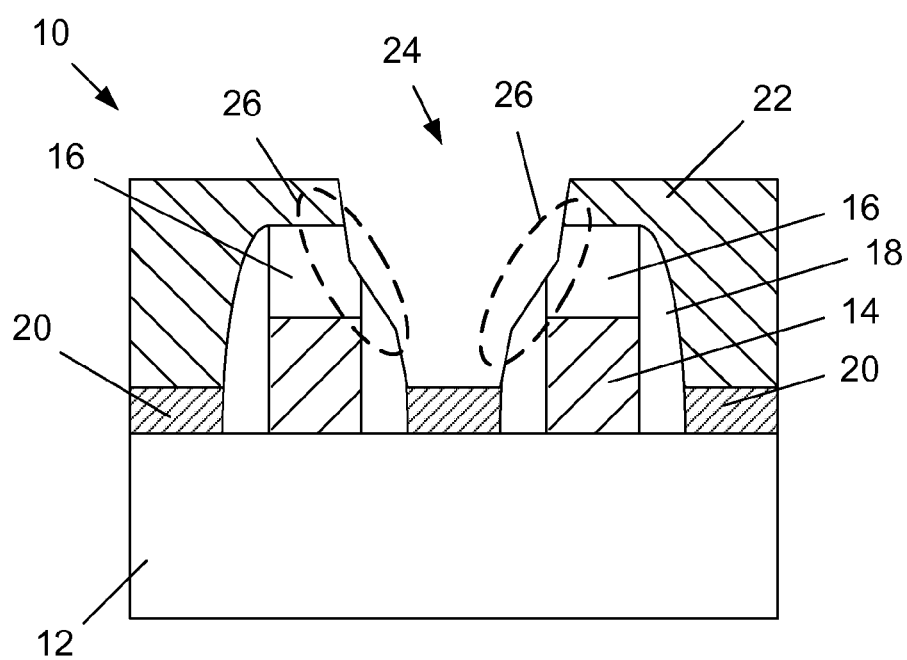

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification.

It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a semiconductor device with a spacer etch block cap, and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 2A:
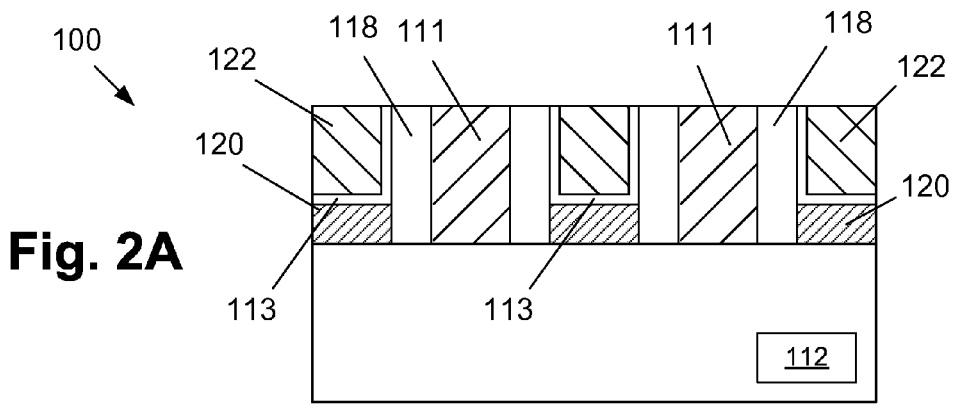
FIGS. 2A-2Q depict various illustrative methods disclosed herein of forming a semiconductor device with a spacer etch block cap, and the resulting semiconductor device.

FIG. 2A schematically illustrates a cross-sectional view of an integrated circuit product 100 at an advanced stage of manufacturing after several process operations were performed. As illustrated, the product 100 comprises a plurality of illustrative, and schematically depicted, sacrificial gate structures 111 that are formed above a substrate 112. Also depicted are an illustrative etch stop layer 113, sidewall spacers 118, raised source/drain regions 120 and a layer of insulating material 122, e.g., silicon dioxide. The substrate 112 may have a variety of configurations, such as the depicted bulk substrate configuration. The substrate 112 may have an SOI (silicon-on-insulator) configuration wherein the semiconductor devices are formed in the active layer of the SOI substrate. The substrate 112 may be made of silicon or it may be made of materials other than silicon. Thus, the terms "substrate," "semiconductor substrate" or "semiconducting substrate" should be understood to cover all semiconducting materials and all forms of such materials. The inventions disclosed herein will be disclosed in the context of forming planar transistor devices using a replacement gate process. However, as will be recognized by those skilled in the art after a complete reading of the present application, the inventions disclosed herein may be applied to the formation of planar FET devices as well as 3D devices, such as FinFET devices. Moreover, the methods disclosed herein are applicable to forming any type of device, e.g., an NFET device, a PFET device, etc.

With continuing reference to FIG. 2A, the sacrificial gate structures 111 are intended to be representative in nature of any type of sacrificial gate structure that may be employed in manufacturing integrated circuit products using so-called gate-last (replacement gate) manufacturing techniques. In general, the sacrificial gate structures 111 are comprised of a sacrificial gate insulation layer (not separately depicted), such as silicon dioxide, and a sacrificial gate electrode (not separately depicted), such as polysilicon or amorphous silicon. In one illustrative replacement gate manufacturing technique, the layers of material for the sacrificial gate structure including a gate cap layer (not shown) are initially formed/deposited above the substrate 112 and thereafter patterned using traditional masking and etching techniques to thereby define the sacrificial gate structure 111 with a gate cap layer (not shown) positioned above the sacrificial gate structure 111. Thereafter, the sidewall spacers 118 are formed adjacent the patterned dummy gate structure/cap layer, and the very thin etch stop layer 113, e.g., silicon nitride, is then conformably deposited across the product 100. The sacrificial gate structure 111 remains in place (protected by the spacers and the gate cap layer) as many process operations are performed to form the devices, e.g., the formation of the depicted raised, doped source/drain regions 120, performing an anneal process to repair damage to the substrate 112 caused by the ion implantation processes and to activate the implanted dopant materials.

With continuing reference to FIG. 2A, the product 100 is depicted after the gate cap layer was removed by performing a chemical mechanical polishing (CMP) process relative to a layer of insulating material 122 so as to expose the dummy gate electrode (polysilicon) of the sacrificial gate structure 111. FIG. 2A depicts an idealized situation wherein the upper surface of the sacrificial gate structure 111, the spacers 118 and the layer of insulating material 122 are all substantially planar. In a "real-world" device, there will be a slight difference in height between the gate electrode of the sacrificial gate structure 111, the spacers 118 and the layer of insulating material 122 due to differences in hardness of the various materials that were removed by the CMP process, and the effect of the polishing slurries on the polished materials. After the sacrificial gate structure 111 is exposed by performing the CMP process, an etching process is performed to insure that the upper surface of the gate electrode of the sacrificial gate structure 111 is clear of the insulating material 122.

Figure 2B:
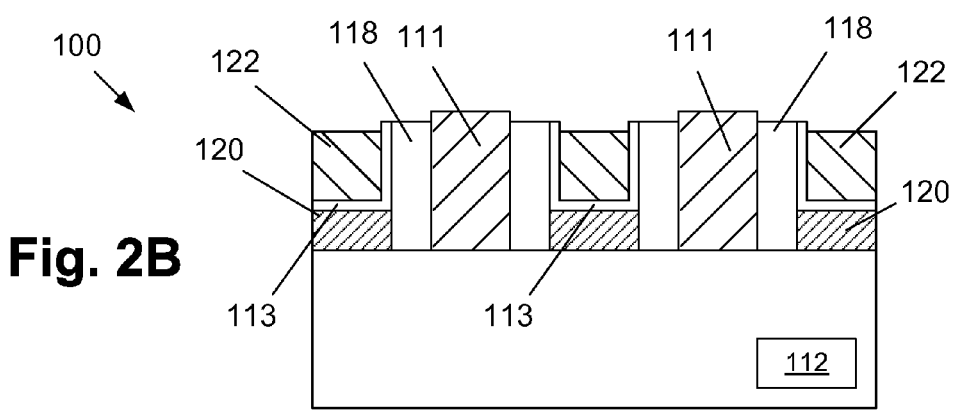

FIG. 2B depicts a more "real-world" example, wherein there is a difference in height between the gate electrode of the sacrificial gate structure 111, the spacers 118 and the layer of insulating material 122 due to performing the above-described CMP and etching processes.

Figure 2C:
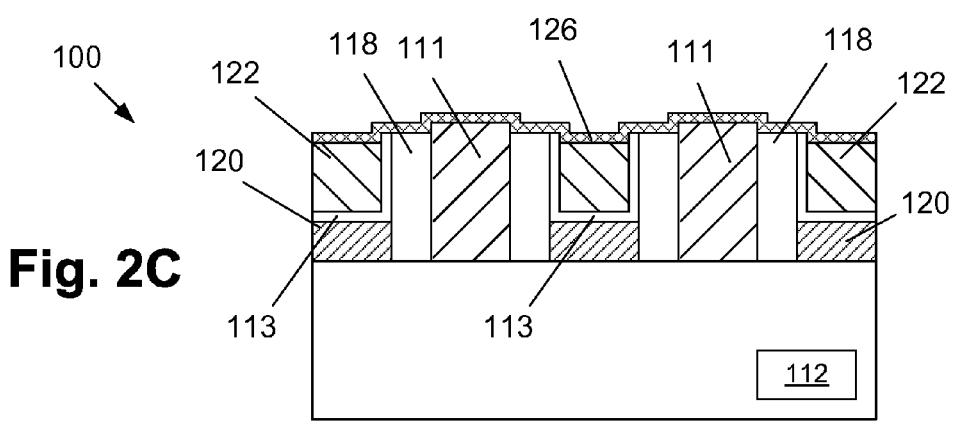

FIG. 2C depicts the product 100 after a gate cap protection layer 126 has been deposited across the product 100. The gate cap protection layer 126 may be comprised of a variety of different materials, e.g., silicon nitride, that exhibit good etch selectivity relative to the layer of insulating material 122. The gate cap protection layer 126 may be formed by performing a variety of techniques, e.g., CVD, ALD, etc. The thickness of the gate cap protection layer 126 may vary depending upon the particular application, e.g., 2-8 nm.

Figure 2D:
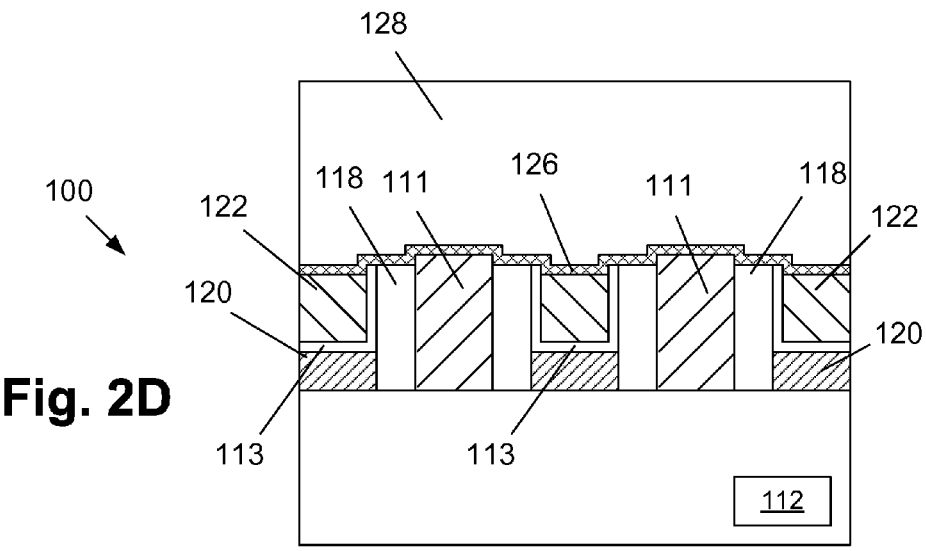

FIG. 2D depicts the product 100 after a layer of insulating material 128 has been deposited across the product 100. The layer of insulating material 128 may be comprised of a variety of different materials, such as silicon dioxide, etc., and it may be formed by performing a variety of techniques, e.g., CVD, etc. The thickness of the layer of insulating material 128 may vary depending upon the particular application. The layer of insulating material 128 may be comprised of the same or different materials as that of the layer of insulating material 122.

Figure 2E:
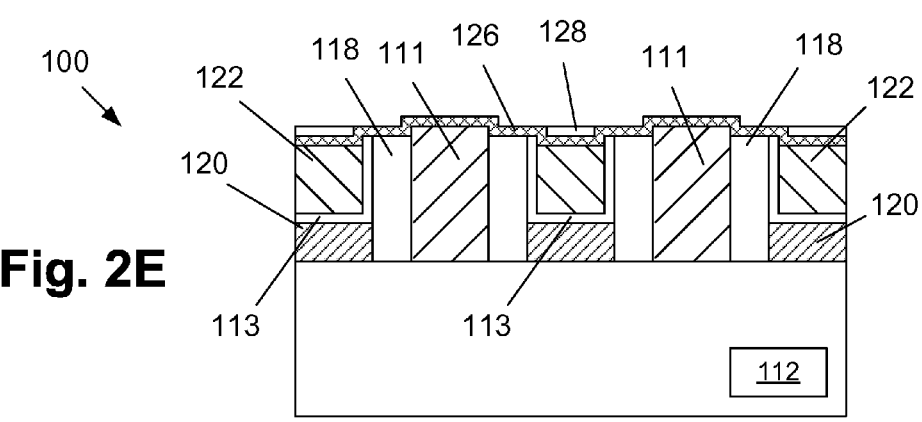

FIG. 2E depicts the product 100 after a CMP process was performed to remove portions of the layer of insulating material 128 positioned above the gate cap protection layer 126. The CMP process may actually stop before it reaches the gate cap protection layer 126 so as not to consume the gate cap protection layer 126, as would be the case where it is used as a polish-stop layer. In that case, after the CMP process, a brief deglaze process may be performed to insure that the oxide material is removed from above the portion of the gate cap protection layer 126 positioned above the sacrificial gate structure 111.

Figure 2F:
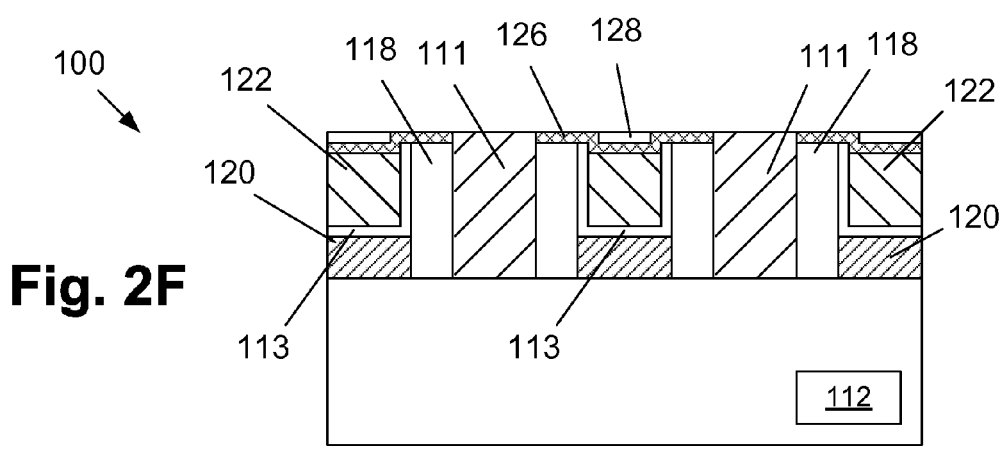

FIG. 2F depicts the product 100 after a chemical mechanical polishing (CMP) process was performed that stopped on the sacrificial gate structure 111. This process exposes the dummy gate electrode (polysilicon) of the sacrificial gate structure 111.

Figure 2G:
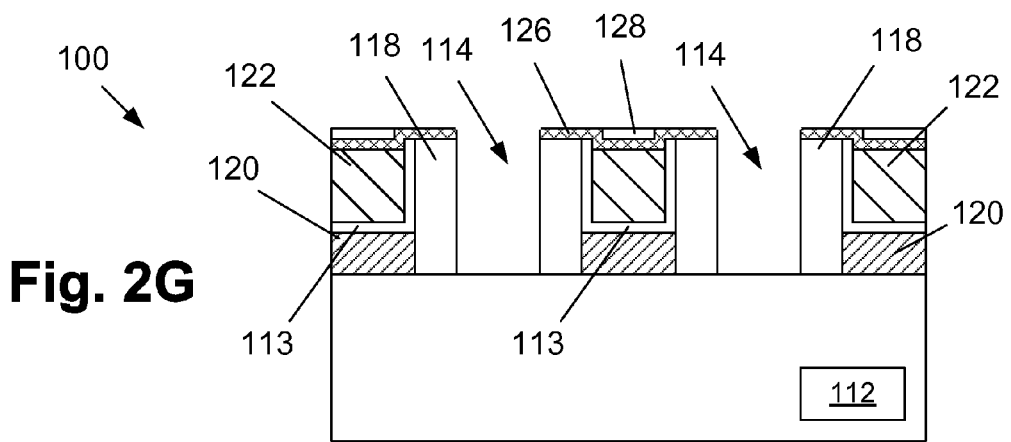

FIG. 2G depicts the product 100 after one or more etching processes were performed to remove the sacrificial gate structure 111 which results in the formation of a replacement gate cavity 114 that is laterally defined by the spacers 118 where the final replacement gate structure for the devices will be formed.

Figure 2H:
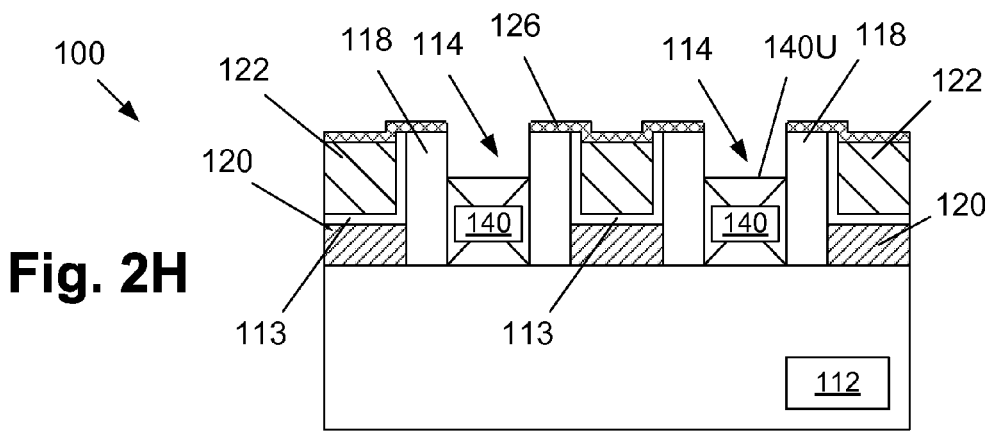

FIG. 2H depicts the device 100 after illustrative and schematically depicted replacement (final) gate structures 140 were formed in the gate cavities 114. The gate structure 140 depicted herein is intended to be representative in nature of any type of replacement gate structure that may be employed in manufacturing integrated circuit products. Typically, a pre-clean process will be performed in an attempt to remove all foreign materials from within the gate cavities 114 prior to forming the various layers of material that will become part of the gate structure 140. The pre-clean process will also remove any residual materials from the layer of insulating material 128. For example, the gate structure 140 may be formed by sequentially depositing the materials of the gate structure in the gate cavities 114 and above the gate cap protection layer 126, performing a CMP process to remove excess materials above gate cap protection layer 126 and then performing an etch-back recess etching process such that the upper surface 140U of the gate structure 140 is at the desired height level. As a specific example, a high-k (k value greater than 10) gate insulation layer (not individually shown), such as hafnium oxide, may be deposited across the product 100 and within the gate cavities 114 on the portions of the substrate 112 (or fin in the case of a FinFET device) exposed by the gate cavities 114 by performing a conformal deposition process, i.e., an ALD or CVD deposition process. If desired, a thin interfacial layer of silicon dioxide (not shown) may be formed prior to the formation the high-k gate insulation layer. Next, at least one work function adjusting metal layer (not separately shown) (e.g., a layer of titanium nitride or TiAlC depending upon the type of transistor device being manufactured) may be deposited on the high-k gate insulation layer and within the gate cavities 114 by performing a conformal ALD or CVD deposition process. Of course, more than one layer of work function metal may be formed in the gate cavities 114, depending upon the particular device under construction. Then, a bulk conductive material, such as tungsten or aluminum, may be deposited in the gate cavities 114 above the work function adjusting metal layer(s). Thereafter, one or more CMP processes were performed to remove excess portions of the various layers of material positioned above the surface of the gate cap protection layer 126. Next, a recess etching process was performed so as to remove a desired amount of the materials of the gate structure 140 such that the upper surface 140U of the gate structures 140 is at the desired height level within the gate cavities 114. Other possible materials for the gate insulation layer in the gate stack include, but are not limited to, tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Other possible materials for the work function adjusting metal layers include, but are not limited to, titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

Figure 2I:
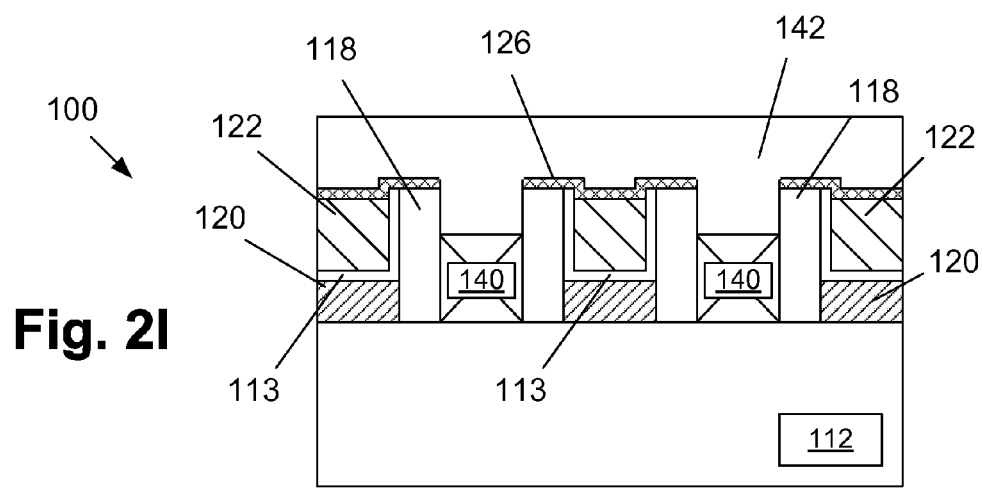

FIG. 2I depicts the product 100 after a layer of insulating material 142 has been deposited across the product 100. The layer of insulating material 142 may be comprised of a variety of different materials, such as silicon dioxide, etc., and it may be formed by performing a variety of techniques, e.g., CVD, etc. The thickness of the layer of insulating material 142 may vary depending upon the particular application. The layer of insulating material 142 may be comprised of the same or different materials as that of the layer of insulating material 122.

Figure 2J:
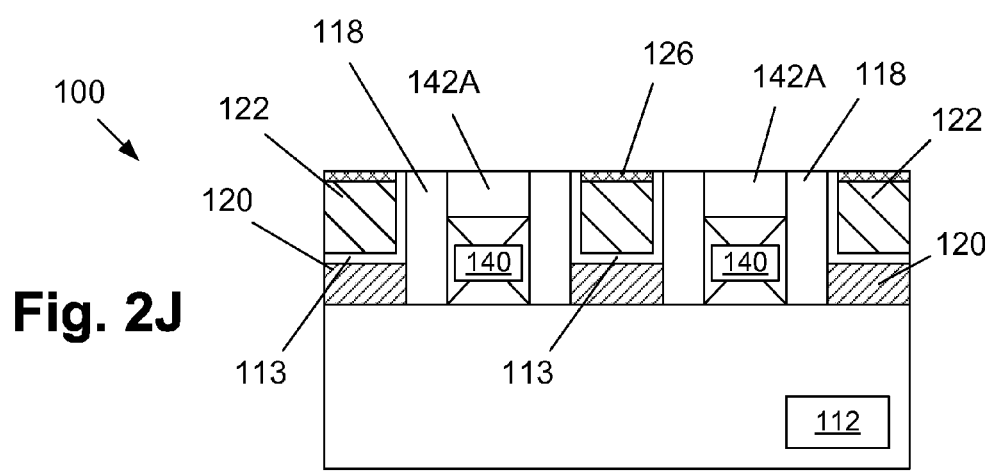

FIG. 2J depicts the product 100 after a CMP process was performed to remove portions of the layer of insulating material 142 positioned above the gate cap protection layer 126. This results in portions of the layer of insulating material 142 becoming a gate cap layer 142A positioned in the gate cavities 114 above the gate structures 140.

Figure 2K:
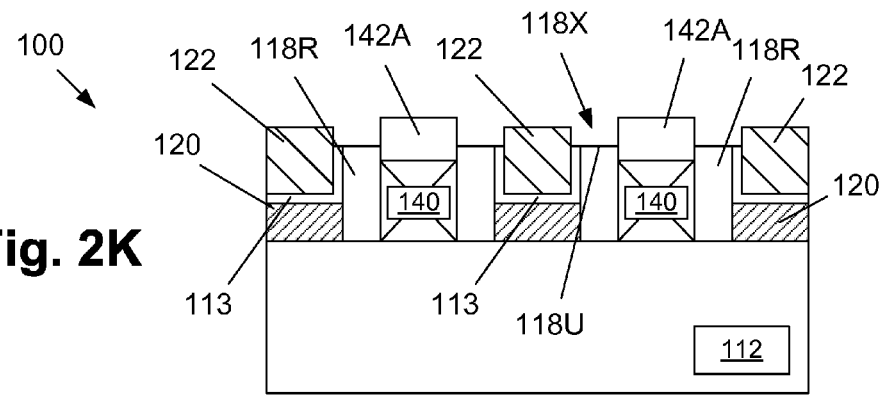

FIG. 2K depicts the product 100 after a timed recess etching process was performed to selectively remove portions of the spacers 118, the etch stop layer 113 and any remaining portions of the gate cap protection layer 126 selectively relative to the surrounding materials. This process operation results in the formation of a plurality of recessed spacers 118R with a spacer recess 118X formed above the recessed spacers 118R. The spacer recess 118X is defined by an upper surface 118U of the recessed spacer 118R, the layer of insulating material 122 and the gate cap layer 142A. The depth of the spacer recess 118X may vary depending upon the particular application. In one illustrative embodiment, the spacer recess 118X may have a depth on the order of about 5-20 nm relative to the upper surface of the layer of insulating material 122. In one illustrative embodiment, the etching process performed to form the spacer recesses 118X may be an anisotropic etching process.

Figure 2L:
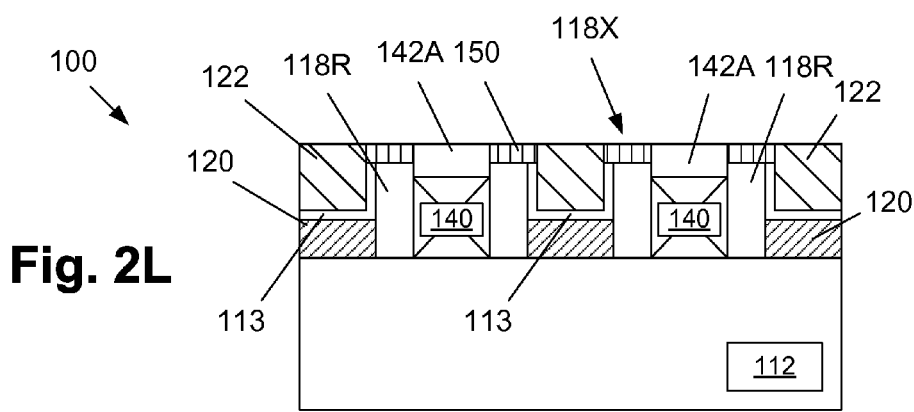

FIG. 2L depicts the product 100 after a spacer etch block cap 150 was formed in each spacer recess 118X. The spacer etch block caps 150 were formed by depositing a layer of etch block material, e.g., a high-k insulating material (which for purposes of the inventions disclosed herein will be understood to have a k-value greater than 10), such as hafnium oxide, aluminum oxide, or a carbon-containing material, such as SiCBN, SiC, etc., so as to overfill the spacer recesses 118X, and thereafter performing a CMP process to remove the excess etch block material using the layer of insulating material 122 as a polish-stop layer. Note that at this point in the process flow, the upper surfaces of the spacer etch block cap 150, the layer of insulating material 122 and the gate cap layer 142A are all substantially planar.

Figure 2M:
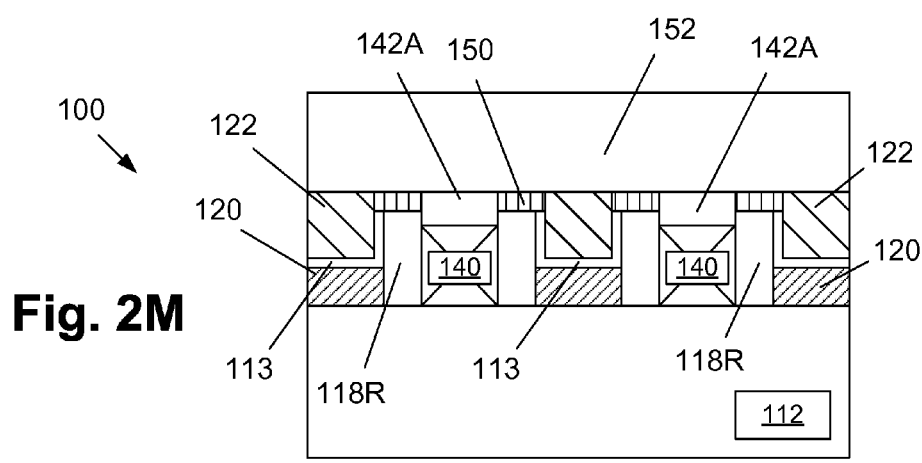

FIG. 2M depicts the product 100 after a layer of insulating material 152 was deposited across the product 100. The layer of insulating material 152 may be comprised of a variety of different materials, such as silicon dioxide, a low-k (k value less than 3.3) material, etc., and it may be formed by performing a variety of techniques, e.g., CVD, etc. The thickness of the layer of insulating material 152 may vary depending upon the particular application.

Figure 2N:
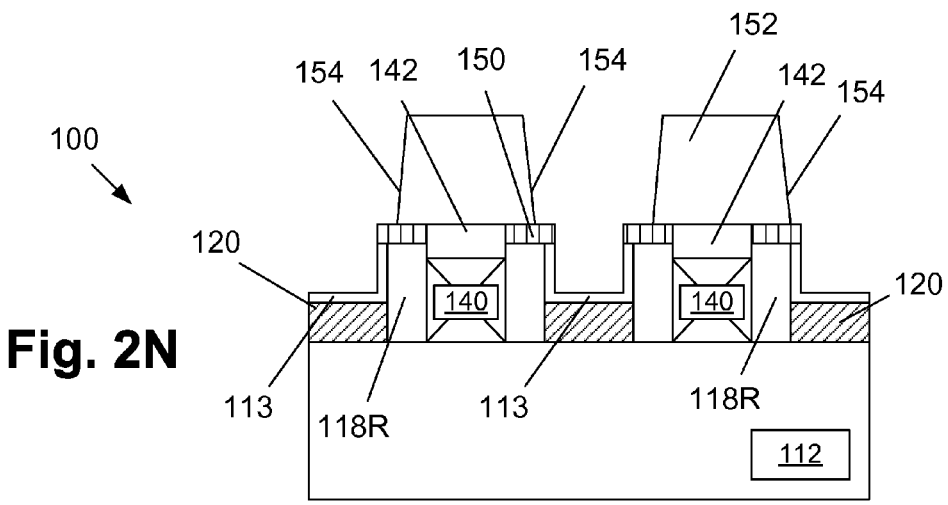

FIG. 2N depicts the product 100 after one or more anisotropic etching processes were performed on the product 100 through a patterned etch mask (not shown), such as a patterned layer of photoresist material, to remove portions of the layer of insulating material 152 and substantially all of the layer of insulating material 122 exposed by the patterned etch mask layer to thereby define a plurality of self-aligned contact openings 154. In the depicted example, the self-aligned contact openings 154 are depicted as being precisely aligned relative to the gate structures 140. However, in a real-world device, the self-aligned contact openings 154 may be somewhat misaligned relative to the gate structures 140. During the formation of the self-aligned contact openings 154, the spacer etch block caps 150 remain in position to protect the gate structure 140. As depicted, formation of the contact openings 154 will likely expose at least a portion of the spacer etch block caps 150. Some of the spacer etch block caps 150 and the etch stop layer 113 may be consumed during the formation of the contact openings 154, although such a situation is not depicted in FIG. 2N.

Figure 2O:
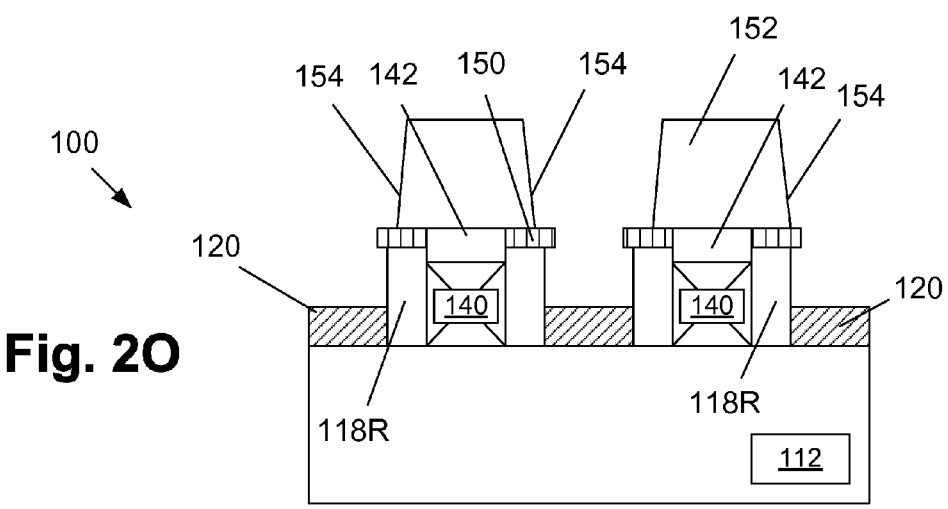

FIG. 2O depicts the device 100 after a very brief "punch through" etching process is performed to remove at least portions of the etch stop layer 113 (as well as any other residual materials) so as to thereby expose the source/drain regions 120. In the depicted example, the etching process removes substantially all of the etch stop layer 113. In some cases, portions of the etch stop layer 113 may remain positioned adjacent the recessed spacers 118R.

Figure 2P:
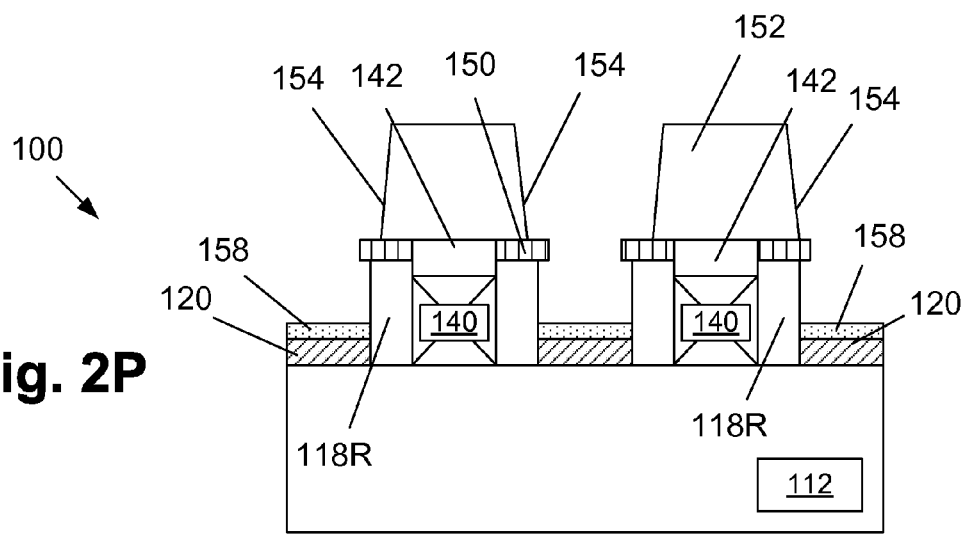

FIG. 2P depicts the product 100 after optional metal silicide regions 158 have been formed in the source/drain regions 120 of the devices through the contact openings 154 in the layer of insulating material 152. The metal silicide regions 158 may be formed by performing traditional silicide formation techniques.

Figure 2Q:
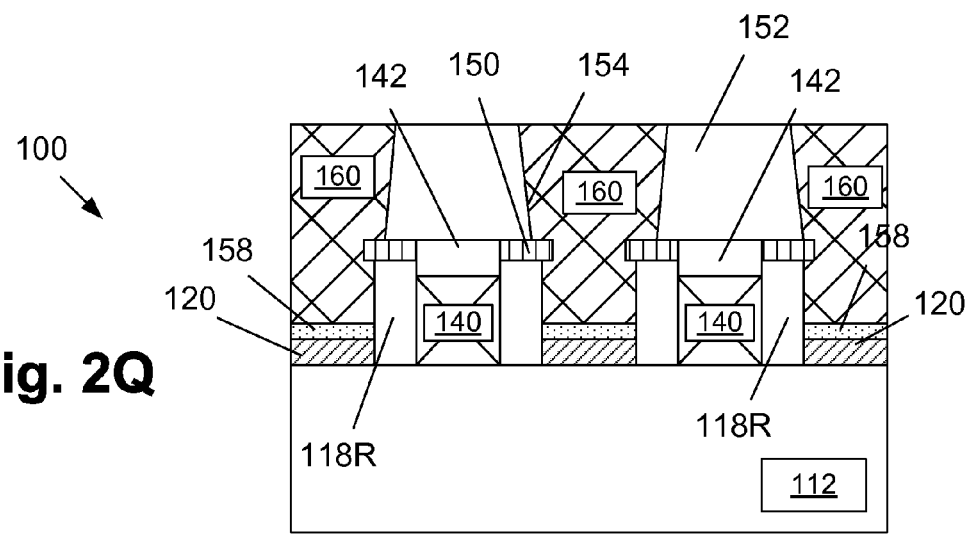

FIG. 2Q depicts the product 100 after conductive, self-aligned contact structures 160 have been formed in the self-aligned contact openings 154 such that they are conductively coupled to the source/drain regions 120. Note that the self-aligned contact structures 160 abut and engage the spacer etch block caps 150. The self-aligned contact structures 160 are intended to be schematic and representative in nature, as they may be formed using any of a variety of different conductive materials and by performing traditional manufacturing operations. The self-aligned contact structures 160 may also contain one or more barrier layers (not depicted). In one illustrative example, the self-aligned contact structures 160 may be formed by depositing a liner, e.g., a titanium nitride liner, followed by overfilling the self-aligned contact openings 154 with a conductive material, such as tungsten. Thereafter, a CMP process may be performed to planarize the upper surface of the layer of insulating material 152 which results in the removal of excess portions of the liner and the tungsten positioned above the layer of insulating material 152 outside of the self-aligned contact openings 154 and the formation of the self-aligned contact structures 160.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device, comprising:
    forming a sacrificial gate structure above a semiconductor substrate;
    forming a sidewall spacer adjacent opposite sides of said sacrificial gate structure, said spacers having a height;
    removing said sacrificial gate structure and forming a replacement gate structure in its place;
    at some point after forming said replacement gate structure, performing an etching process to reduce said height of said spacers so as to thereby define recessed spacers having an upper surface that partially defines a spacer recess; and
    forming a spacer etch block cap on said upper surface of each recessed spacer structure and within said spacer recess.

2. The method of claim 1, wherein, prior to performing said etching process to reduce said height of said spacers, the method further comprises:
    forming a first layer of insulating material above said substrate;
    forming a gate cap layer above said replacement gate structure, wherein said spacer recess is defined by said upper surface of said recessed spacer, said first layer of insulating material and said gate cap layer.

3. The method of claim 1, wherein said spacer etch block caps are comprised of a high-k material or a carbon-containing material.

4. The method of claim 3, wherein said sidewalls spacers are comprised of silicon nitride.

5. The method of claim 1, wherein forming said spacer etch block cap comprises:
    depositing a layer of material for said spacer etch block caps across said substrate and in said spacer recesses; and
    performing a CMP process to remove excess portions of said layer of material so as to thereby define said spacer etch block caps positioned in said spacer recesses.

6. The method of claim 2, wherein said gate cap layer is comprised of silicon dioxide.

7. The method of claim 1, further comprising;
    forming a second layer of insulating material above said first layer of insulating material;

forming a self-aligned contact opening through said first and second layers of insulating material, wherein a portion of at least one of said spacer etch block caps is exposed by the formation of said self-aligned contact opening; and forming a contact in said self-aligned contact opening that is conductively coupled to a source/drain region of said device, wherein said contact abuts and engages said spacer etch block cap.

8. The method of claim 1, wherein said transistor device is one of a planar transistor device or a FinFET transistor device.

9. The method of claim 1, wherein said spacer etch block caps completely cover an entirety of said upper surfaces of said recessed spacer structures.

10. A method of forming a transistor device, comprising:
forming a sacrificial gate structure above a semiconductor substrate;
forming a sidewall spacer adjacent opposite sides of said sacrificial gate structure, said spacers having a height;
forming a first layer of insulating material above said substrate;
removing said sacrificial gate structure so as to thereby define a replacement gate cavity;
forming a replacement gate structure in said replacement gate cavity;
forming a gate cap layer above said replacement gate structure;
after forming said gate cap layer, performing an etching process to reduce said height of said spacers so as to thereby define recessed spacers with a spacer recess formed thereabove, wherein said spacer recess is defined by an upper surface of said recessed spacer, said first layer of insulating material and said gate cap layer; and
forming a spacer etch block cap on said upper surface of each recessed spacer structure and within said spacer recess.

11. The method of claim 10, wherein said spacer etch block caps are comprised of a high-k material or a carbon-containing material.

12. The method of claim 11, wherein said sidewalls spacers are comprised of silicon nitride.

13. The method of claim 10, wherein forming said spacer etch block cap comprises:
depositing a layer of material for said spacer etch block caps across said substrate and in said spacer recesses; and
performing a CMP process to remove excess portions of said layer of material so as to thereby define said spacer etch block caps positioned in said spacer recesses.

14. The method of claim 10, wherein said gate cap layer is comprised of silicon dioxide.

15. The method of claim 10, further comprising;
forming a second layer of insulating material above said first layer of insulating material;
forming a self-aligned contact opening through said first and second layers of insulating material, wherein a portion of at least one of said spacer etch block caps is exposed by the formation of said self-aligned contact opening; and
forming a contact in said self-aligned contact opening that is conductively coupled to a source/drain region of said device, wherein said contact abuts and engages said spacer etch block cap.

16. The method of claim 10, wherein said spacer etch block caps completely cover an entirety of said upper surfaces of said recessed spacer structures.

17. A transistor device, comprising:
a gate structure positioned above a semiconductor substrate;
a spacer positioned adjacent opposite sides of said gate structure, said spacers having an upper surface;
a gate cap layer positioned above said gate structure, wherein an upper surface of said gate cap layer is positioned above said upper surface of said spacers, a lower surface of said gate cap layer is positioned below said upper surface of said spacers, and a portion of said gate cap layer is positioned between said spacers;
a first layer of insulating material positioned above said substrate, wherein an upper surface of said first layer of insulating material is substantially planar with said upper surface of said gate cap layer and wherein said upper surface of said spacer, said first layer of insulating material and said gate cap layer define a spacer recess above each of said spacers; and
a spacer etch block cap positioned on said upper surface of each spacer and within said spacer recess.

18. The device of claim 17, further comprising;
a second layer of insulating material positioned above said first layer of insulating material;
a self-aligned contact opening that extends through said first and second layers of insulating material; and
a contact positioned in said self-aligned contact opening that is conductively coupled to a source/drain region of said device, wherein said contact abuts and engages at least one of said spacer etch block caps.

19. The device of claim 17, wherein said spacer etch block caps completely cover an entirety of said upper surfaces of said spacers.

20. The device of claim 17, wherein said spacer etch block caps are comprised of a high-k material or a carbon-containing material.

21. The device of claim 20, wherein said spacers are comprised of silicon nitride.

22. The device of claim 21, wherein said gate cap layer is comprised of silicon dioxide.

* * * * *